United States Patent
Masaki (10) Patent No.: US 7,235,775 B2
(45) Date of Patent: Jun. 26, 2007

(54) INFRARED IMAGING APPARATUS FOR PROCESSING EMISSIONS IN INFRARED AND VISIBLE SPECTRUM

(75) Inventor: Yasuo Masaki, Daito (JP)

(73) Assignee: Funai Electric Co., Ltd., Daito-shi, Osaka (JP)

( * ) Notice: Subject to any disclaimer, the term of this patent is extended or adjusted under 35 U.S.C. 154(b) by 0 days.

(21) Appl. No.: 11/239,827

(22) Filed: Sep. 30, 2005

(65) Prior Publication Data

US 2006/0071156 A1   Apr. 6, 2006

(30) Foreign Application Priority Data

Oct. 6, 2004   (JP)   ............... 2004-293403

(51) Int. Cl.
*G01J 3/50* (2006.01)
*G01J 5/02* (2006.01)
*H01L 25/00* (2006.01)

(52) U.S. Cl. .................. 250/226; 250/332; 250/339.02
(58) Field of Classification Search ................ 250/226, 250/339.02, 339.05, 339.06, 332, 338.1, 250/370.08, 339.11; 348/342, 266; 356/402, 356/416

See application file for complete search history.

(56) References Cited

U.S. PATENT DOCUMENTS 5,555,464 A * 9/1996 Hatlestad .................... 348/266

6,211,521 B1 * 4/2001 Bawolek et al. ....... 250/339.02
6,580,459 B2 * 6/2003 Uchino ....................... 348/342

FOREIGN PATENT DOCUMENTS

JP   2000-278701   10/2000
JP   2002-171519   6/2002

* cited by examiner

*Primary Examiner*—Thanh X. Luu
(74) *Attorney, Agent, or Firm*—Peter Ganjian

(57) ABSTRACT

The infrared imaging apparatus comprises a CCD sensor 13 having sensitivities in the infrared region and visible region; three color filters FR, FG, FB each transmitting visible light in a specific wavelength region and infrared light in a specific wavelength region; and an infrared transmission filter 12 for allowing infrared light to pass through while removing visible light, wherein the CCD sensor 13 is configured to generate an imaging signal based on the infrared light passing through each of the color filters, the infrared imaging apparatus enabling the provision of the infrared imaging apparatus picking up the infrared light as the imaging light using the CCD sensor and the color filters as they are in the general imaging apparatus. As a result, a color imaging signal depending on the spectral distribution in the infrared region can be obtained without an expensive infrared CCD.

13 Claims, 7 Drawing Sheets

INFRARED IMAGING APPARATUS FOR PROCESSING EMISSIONS IN INFRARED AND VISIBLE SPECTRUM

BACKGROUND OF THE INVENTION

1. Field of the Invention

The present invention relates to an infrared imaging apparatus.

2. Description of the Related Art

Heretofore, there has been known an infrared imaging apparatus comprising an image sensor such as an infrared CCD sensor in which light-sensitive elements configured to have a higher sensitivity in the infrared region are arranged in a matrix-like fashion (for example, see Japanese Patent Publication Laid-Open No. 2000-278701, Japanese Patent Publication Laid-Open No. 2002-171519).

However, the infrared CCD sensor or other sensors with a higher sensitivity in the infrared region as described above is generally expensive, so that the infrared imaging apparatus used in a night vision camera for security and other purposes is more expensive than the general imaging apparatus which picks up visible light as the imaging light.

Further, there has been a problem that as imaging signals obtained from the general infrared imaging apparatus are white/black signals (brightness signals), information on the spectral distribution in the infrared region of an object cannot be obtained and thereby the imaging signals (such as color imaging signals) depending on the spectral distribution cannot be obtained.

SUMMARY OF THE INVENTION

The present invention was made in light of the above problem, and its object is to provide an infrared imaging apparatus capable of obtaining an imaging signal depending on the spectral distribution in the infrared region of an object, in addition to enabling the manufacturing cost to be reduced.

In order to achieve the above object, one aspect of the present invention resides in an infrared imaging apparatus that includes an infrared light source with an emission distribution in the infrared region; an imaging lens; an image sensor in which light-sensitive elements with sensitivities in the infrared region and in the visible region are arranged in a matrix-like fashion; and a plurality of color filters attached to each of the light-sensitive elements and transmitting visible light of a specific wavelength region and infrared light of a specific wavelength region.

In this aspect, the infrared imaging apparatus further includes: an infrared transmission filter for allowing infrared light to pass through while removing visible light; and an imaging signal generation circuit for generating an imaging signal based on the infrared light incident to the image sensor.

In the aspect of the invention configured as described above, the infrared imaging apparatus includes an infrared light source with an emission distribution in the infrared region; an imaging lens; an image sensor in which light-sensitive elements with sensitivities in the infrared region and in the visible region are arranged in a matrix-like fashion; and a plurality of color filters attached to each of the light-sensitive elements and transmitting visible light in a specific wavelength region and infrared light in a specific wavelength region. An image sensor that the general imaging apparatus picking up the visible light as the imaging light includes naturally has sensitivity in the visible region and also has sensitivity in the infrared region unnecessary in the case in which the visible light is picked up as the imaging light. Further, the color filters for dispersing the light from the imaging lens the general imaging apparatus includes (for example, the color filters for dispersing into respective colors of R (red), G (green), B (blue)) each transmits not only visible light in a specific wavelength region but also infrared light in a specific wavelength region.

Further, the infrared imaging apparatus of the present invention includes an infrared transmission filter for allowing infrared light to pass through while removing visible light and an imaging signal generation circuit for generating an imaging signal based on the infrared light incident to the image sensor. The general imaging apparatus as described above picks up the visible light as the imaging light in which a visible light transmission filter for allowing only visible light to pass through by cutting unnecessary infrared light is used, however, the present invention, on the other hand, uses an infrared transmission filter for allowing only infrared light to pass through by cutting visible light. As described above, the image sensor with sensitivities in both of the infrared region and the visible region is subjected to the infrared light passing through the infrared transmission filter to generate an imaging signal. This configuration enables the provision of an infrared imaging apparatus that picks up the infrared light as the imaging light using the image sensor and the color filters as they are in the general imaging apparatus. As a result, an expensive image sensor such as an infrared CCD sensor no longer needs to be mounted, so that the manufacturing cost can be reduced. In addition, the imaging signal depending on the spectral distribution in the infrared region can be obtained, so that a color image can also be obtained.

The infrared imaging apparatus which generates the imaging signal from the infrared light incident to the image sensor, can detect, for example, infrared light with a specific wavelength reflected by human skin and thereby can be used as a human detection sensor. Further, the infrared imaging apparatus which generates the imaging signal from the infrared light, can take images even in the dark without any visible light and thereby can be applied to a security camera for taking images of suspicious individuals or a camera for checking the behaviors of the patients during sleep in a hospital.

Another aspect of the present invention is configured to include a digital conversion processor for converting the imaging signal from the imaging sensor into a digital signal and a memory for temporarily storing the digital signal converted by the digital conversion processor.

In the aspect configured as described above, when the converted digital signal is stored in the memory, various types of image processing operations can be applied to the stored digital signal.

Further, the another aspect of the present invention is configured such that the image sensor is a CCD sensor.

In the another aspect of the present invention configured as described above, because currently many types of CCD sensors are commercially distributed, a CCD sensor having specifications (a resolution and a size) corresponding to the purpose may easily be selected. Further the infrared imaging apparatus can be downsized.

Still another aspect of the present invention is configured such that the image sensor is a CMOS sensor.

The still another aspect of the present invention configured as described above in which the infrared transmission filter is removably provided, enabling the power consumption of the infrared imaging apparatus to be reduced and allowing integration with the digital conversion circuit and other related components, thereby the downsizing of the apparatus can be realized.

Further, the still another aspect of the present invention is configured such that the infrared transmission filter is removably provided.

In the still another aspect of the present invention configured as described above, since the infrared transmission filter is removably provided, the general imaging apparatus picking up the visible light as the imaging light can be provided by removing the infrared transmission filter and mounting the visible light transmission filter. Incidentally, the imaging signal when the visible light is picked up as the imaging signal can be obtained from an imaging signal taken in the state in which the infrared transmission filter is removed (in the state in which neither of the infrared transmission filter nor the visible light transmission filter is mounted) and an imaging signal taken with the infrared transmission filter mounted. Using either of the above two methods, the general imaging apparatus picking up the visible light as the imaging light can be configured.

DESCRIPTION OF THE PREFERRED EMBODIMENTS

Figure 1:
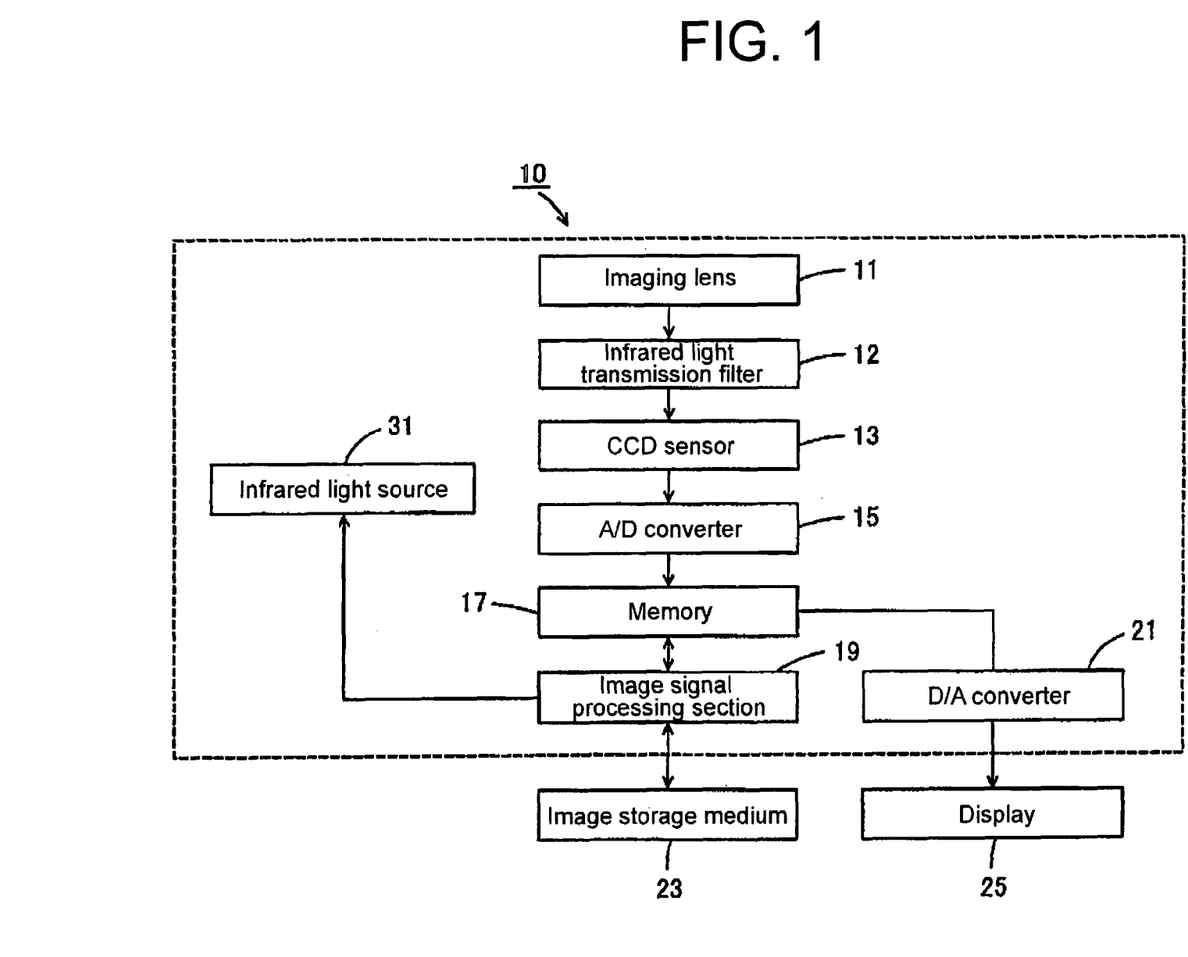
FIG. 1 is a block diagram showing a general configuration of an infrared light imaging apparatus according to one aspect of the invention.

FIG. 1 is a block diagram showing a general configuration of an infrared light imaging apparatus according to the present invention. Incidentally, in the embodiment below, the case where the image sensor the infrared imaging apparatus comprises is a CCD sensor will be described, however, the image sensor is not limited to the CCD sensor and any other sensors such as a CMOS sensor may be employed. In FIG. 1, an infrared image apparatus 10 includes an infrared light source 31, an imaging lens 11, a CCD sensor 13, an A/D converter 15, a memory 17, an image signal processing section 19, and a D/A converter 21.

Figure 2:
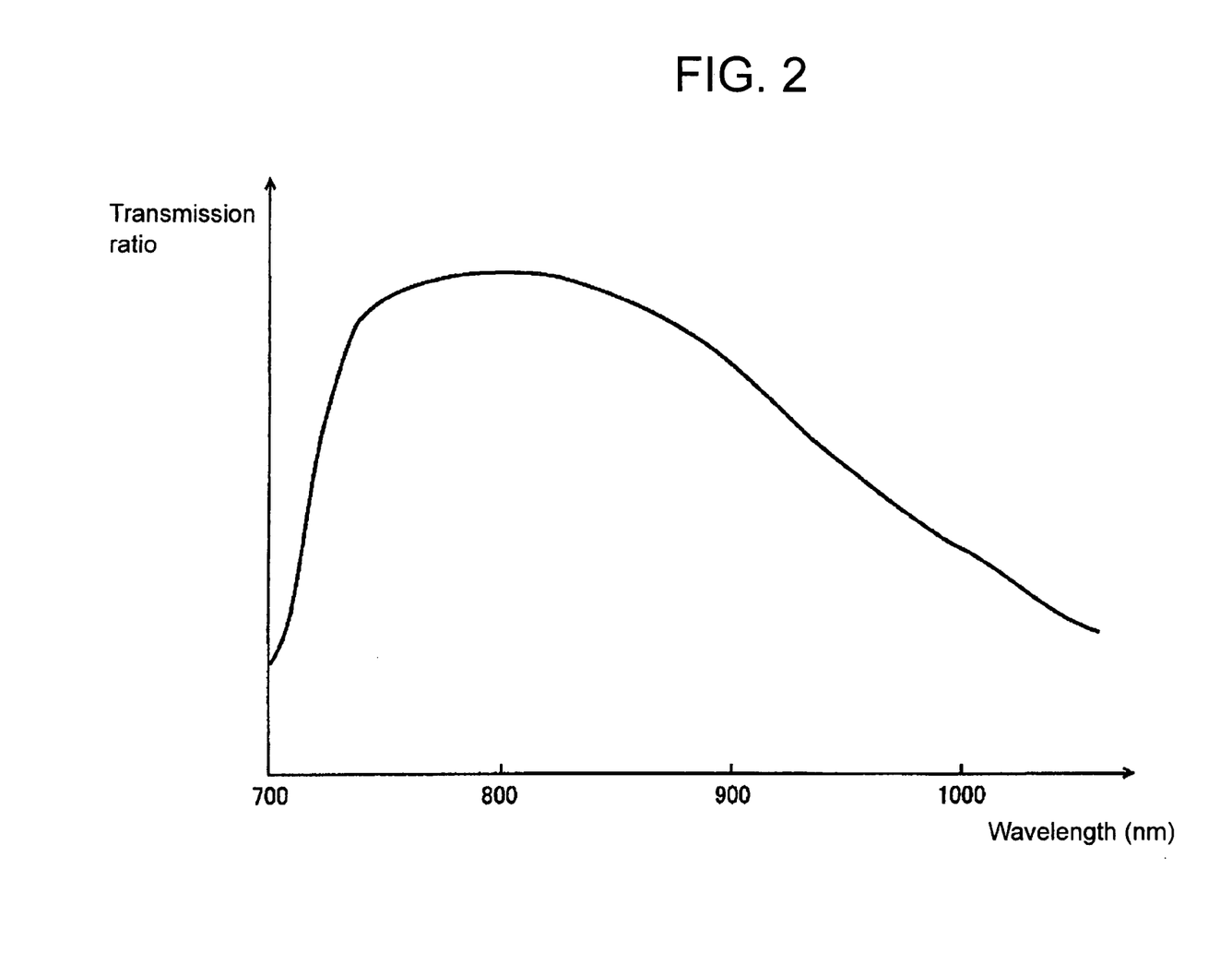
FIG. 2 is a view showing an emission distribution of an infrared light lamp composing an infrared light source.

The infrared light source 31 comprises one infrared light lamp capable of radiating infrared light having an emission distribution in a predetermined wavelength region in the near infrared region (the wavelength is in the range of 720 to 2500 nm), in which the emission distribution is, for example, as shown in FIG. 2. FIG. 2 shows that the one infrared light lamp composing the infrared light source 31 has an emission distribution in the wavelength range of about 700 to 1000 nm.

Figure 3:
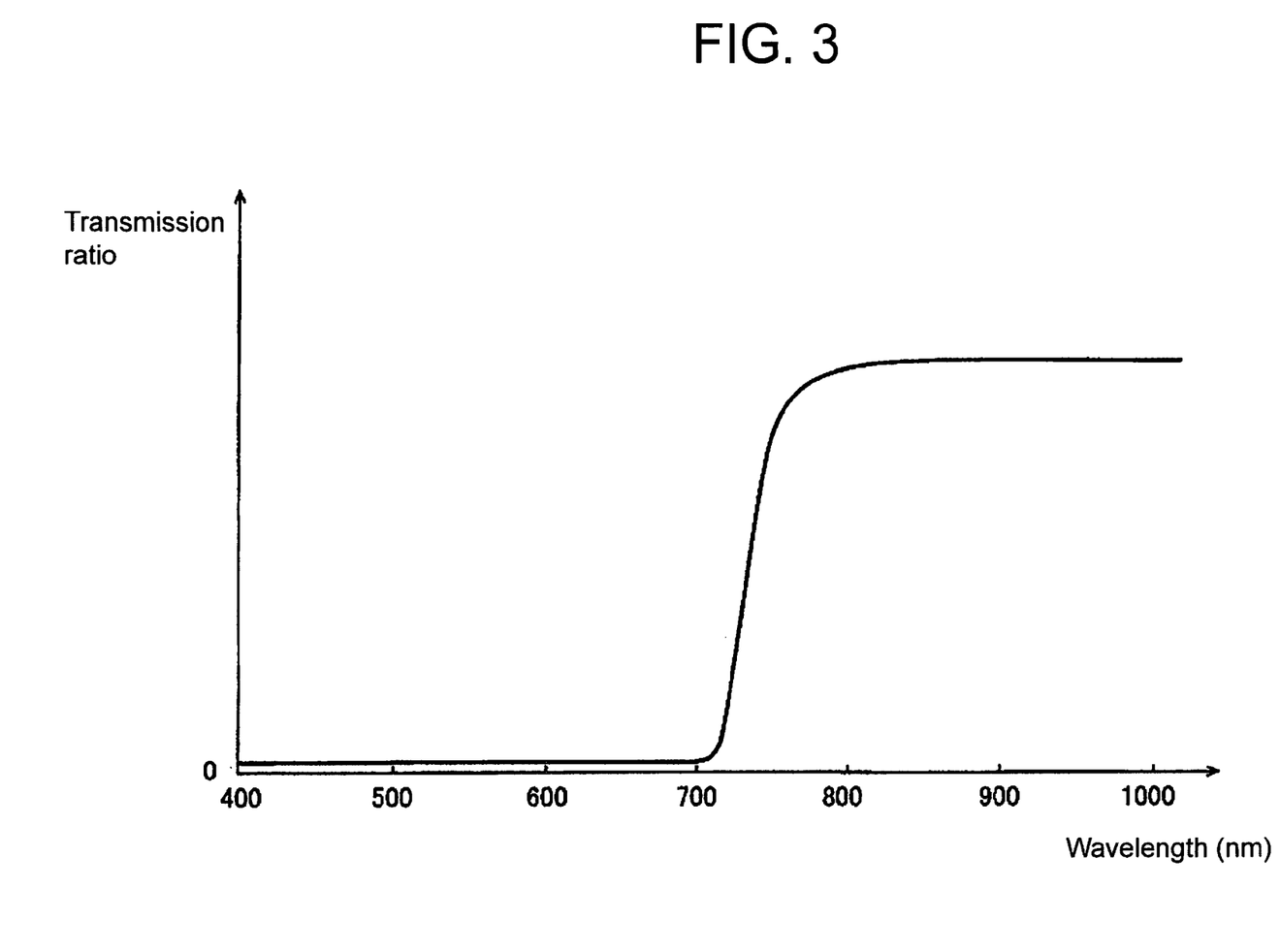
FIG. 3 is a view showing a spectral property of an infrared transmission filter.

An infrared transmission filter 12 which is provided on a light path between the imaging lens and the CCD sensor 13 described below is configured so as to, as shown in FIG. 3, transmit infrared light while bouncing and removing visible light. FIG. 3 shows that, as the spectral property of the infrared transmission filter 12, the transmission ratio of the visible light with a wavelength of 700 nm or less is about equal to 0 (zero) while the transmission ratio of the infrared light with a wavelength of over 700 nm becomes higher.

The CCD sensor 13 is subjected to the visible light incident to the imaging lens 11 to generate an imaging signal. Incidentally, this CCD sensor 13 is a CCD sensor used in the general imaging apparatus picking up the visible light as the imaging light, having sensitivity relative to the visible light as well as sensitivity relative to the infrared light. Incidentally, this CCD sensor 13 will be described with reference to the figure (FIG. 3) below. Further, the A/D converter 15 is that for converting the imaging signal generated by the CCD sensor 13 into a digital signal. The memory 17 temporarily stores the digital signal for one picture converted by the A/D converter 15.

The image signal processing section 19 is a microprocessor, including such circuits as an RGB matrix circuit for generating an RGB signal and an encoder circuit for generating an image signal of a predetermined system (for example, the NTSC system) from the RGB signal to carry out various types of processing operations for generating a digital imaging signal from the digital signal converted by the A/D converter 15. This image signal processing section 19 is that functions as the imaging signal generation circuit. The memory 17 described above is used as a work area when the image signal processing section 19 carries out various types of processing operations. Further, the image signal processing section 19 sends a drive signal for causing the infrared light source 31 to radiate infrared light in a predetermined timing. Further, the image signal processing section 19 compresses the generated digital imaging signal based on a predetermined compression format (for example, MPEG and the like) to carry out the processing of causing an image storage medium 23 to store the compressed signal. As the image storage medium 23, for example, a DVD (Digital Video Disc) and a semiconductor memory and the like may be employed. Further, the digital imaging signal stored in the memory 17 can also be converted into an analog signal by the D/A converter 21 and output to a display 25.

Figure 4:
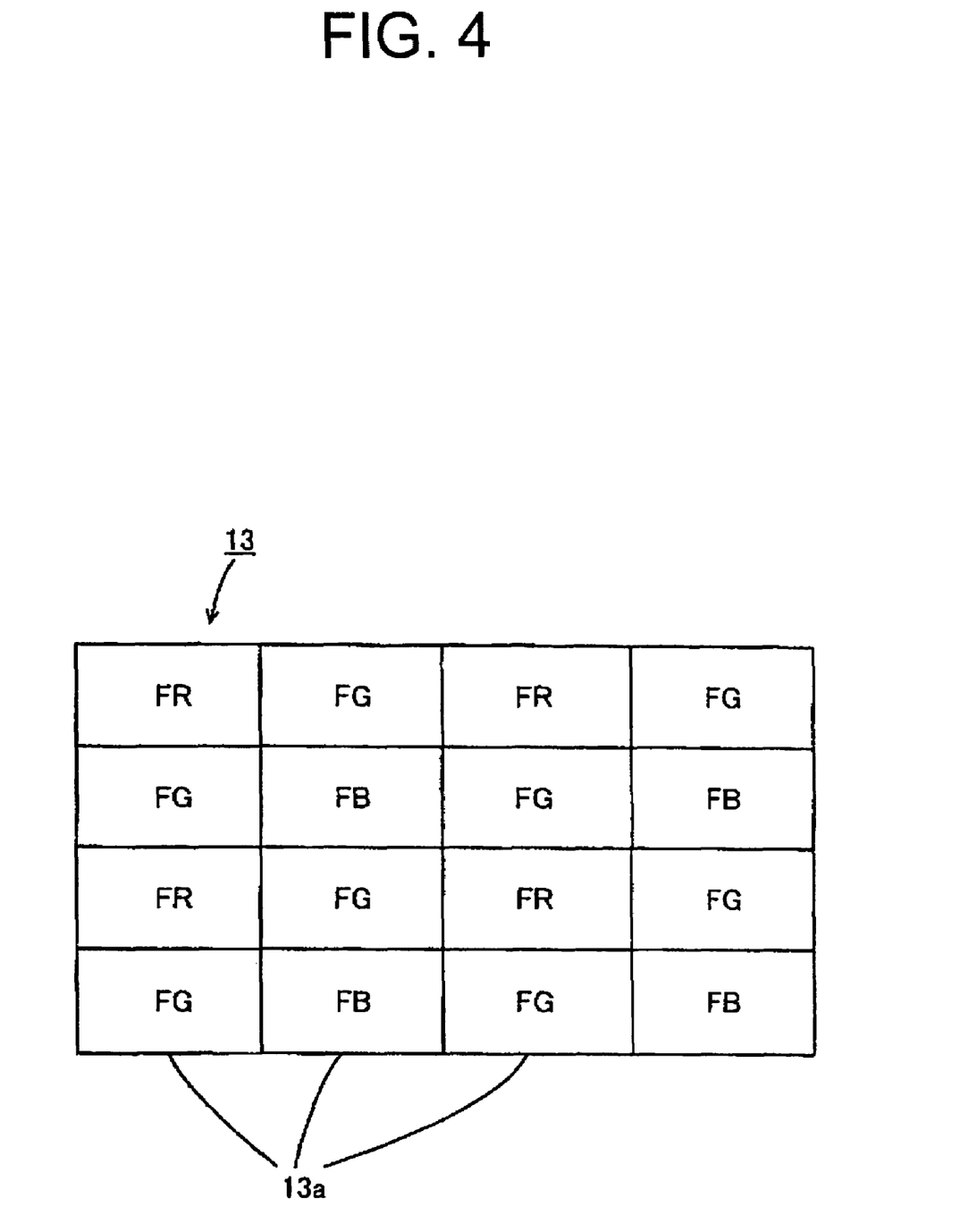
FIG. 4 is a diagram schematically showing a configuration of a CCD sensor.

FIG. 4 is a diagram schematically showing a configuration of the CCD sensor 13. In the figure, the CCD sensor 13 includes light-sensitive elements 13a arranged in a matrix-like fashion in the horizontal direction (in the row direction) and in the vertical direction (in the column direction). The light-sensitive elements 13a have sensitivities in both of the infrared region and the visible region. Further, on a front side of each of the light-sensitive elements 13a, a color filter FR allowing only R (red) light to pass through, a color filter FG allowing only G (green) light to pass through, and a color filter FB allowing only B (blue) light to pass through are provided so as to be placed in a predetermined array (in FIG. 4, the so-called Bayer array) respectively. Incidentally, such color filters can be formed by patterning and staining casein and other proteins on each of the front surfaces thereof in the process of the photoresist of the CCD sensor. The color filter FR, the color filter FG, and the color filter FB transmit the R light, G light, and B light of the visible light respectively, and as shown in FIG. 5, the filters can also transmit infrared light with a specific wavelength region.

Figure 5:
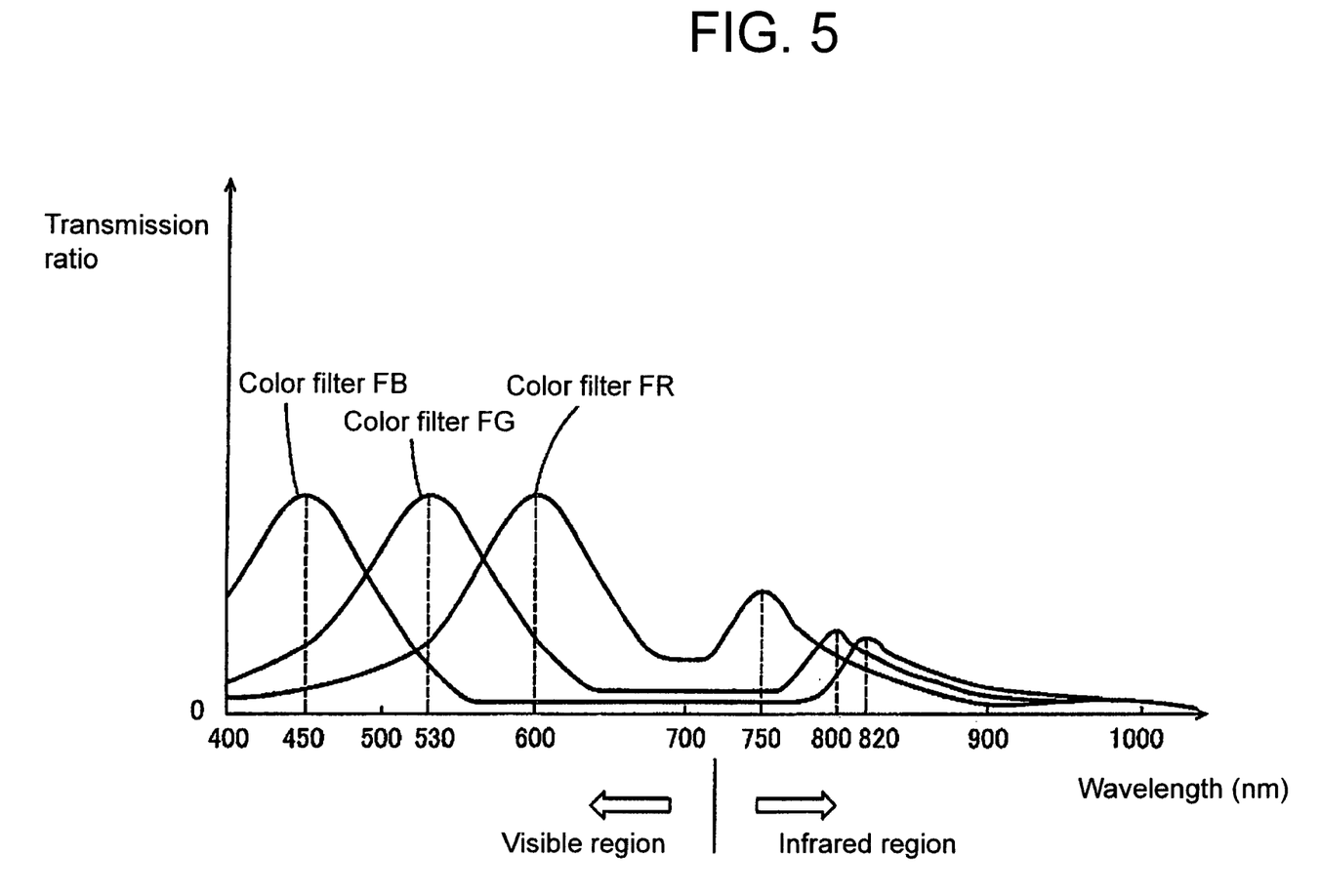
FIG. 5 is a view showing a spectral property of color filters of three colors.

FIG. 5 is a view showing the spectral properties of the three color filters (the color filter FR, the color filter FG and the color filter FB). As shown in the figure, the color filter FR allowing R light to pass through allows the infrared light with a wavelength around 750 nm to pass through, in addition to allowing the visible light with a wavelength around 600 nm to pass through. The color filter FG allowing G light to pass through can allow the infrared light with a wavelength around 800 nm to pass through, in addition to allowing the visible light with a wavelength around 530 nm to pass through. The color filter FB allowing B light to pass through can allow the infrared light with a wavelength around 820 nm to pass through, in addition to allowing the visible light with a wavelength around 450 nm to pass through.

The general imaging apparatus picking up the visible light as the imaging light is configured to cause the visible light to be incident to the image sensor to generate an imaging signal using the visible light transmission filter allowing visible light to pass through while removing infrared light, however, the infrared imaging apparatus 10 according to the embodiment, as described above, uses the infrared transmission filter 11 that allows infrared light unnecessary in the general imaging apparatus to pass through while removing visible light necessary in the general imaging apparatus. The infrared imaging apparatus 10 is configured to cause the transmitted infrared light to be incident to the CCD sensor 13 as the image sensor to generate the imaging signal based on that infrared light.

Figure 6:
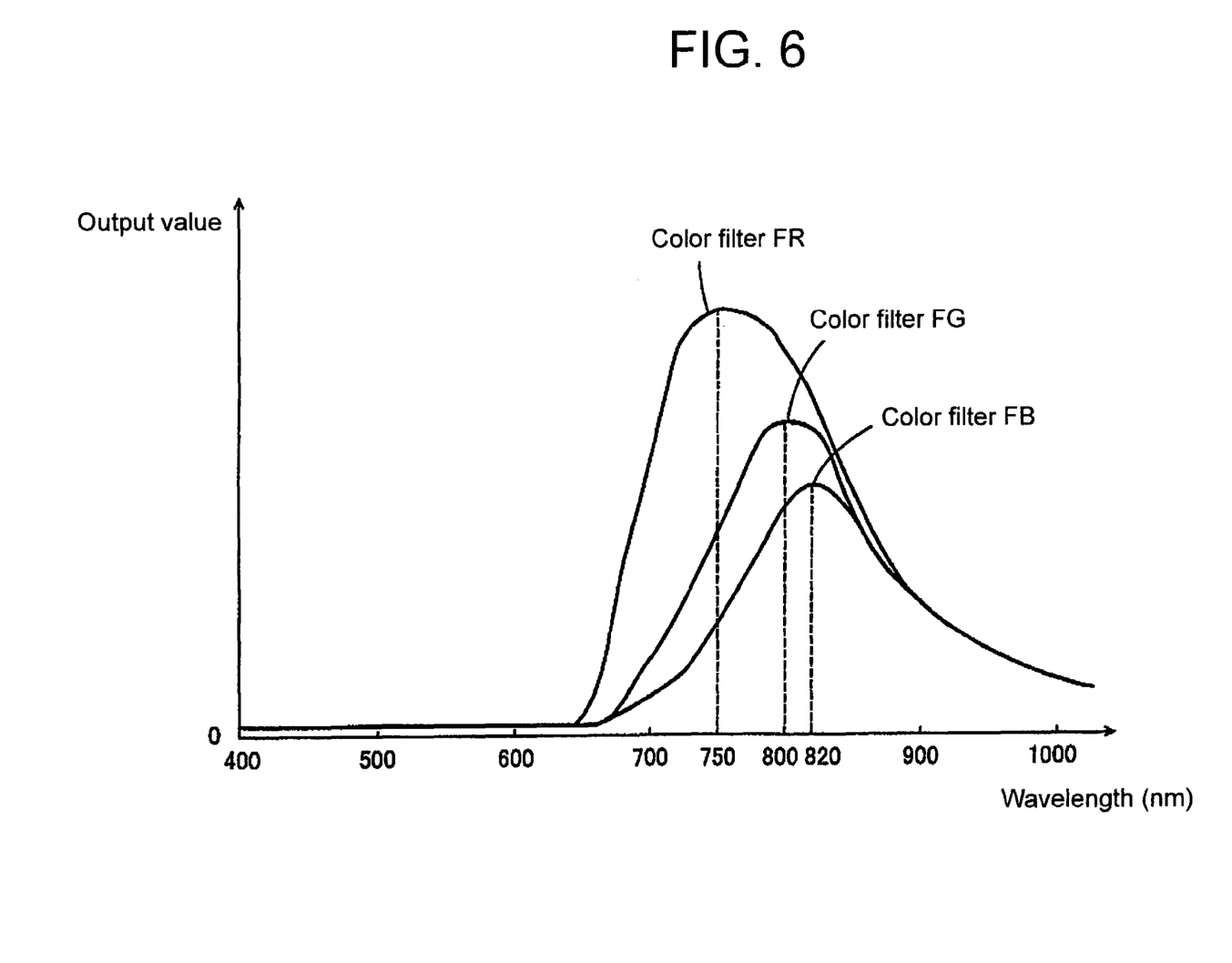
FIG. 6 is a view showing output values of imaging signals of the CCD sensor.

Hereinafter the output values of the imaging signal in the incident of the infrared light having passed through the infrared transmission filter 11 to the CCD sensor 13 with the three color filters (the color filter FR, the color filter FG and the color filter FB) formed therein will be described with reference to FIG. 6. FIG. 6 is a view showing the output values of the imaging signal in the CCD sensor 11 when the infrared transmission filter 11 is provided. In the figure, the visible light is removed by the infrared transmission filter 11, so that the visible light is never incident to the CCD sensor 13.

On the other hand, in the infrared region, the color filter FR allows the infrared light with a wavelength around 750 nm to pass through (see FIG. 5), so that the output value in this wavelength region is high. The color filter FG allows the infrared light with a wavelength around 800 nm to pass through (see FIG. 5), so that the output value in this wavelength region is high. The color filter FB allows the infrared light with a wavelength around 820 nm to pass through (see FIG. 5), so that the output value in this wavelength region is high.

In addition, as shown in FIG. 6, since the peak values of the output value of the imaging signal when each of the color filters is provided are different from each other, a color imaging signal can be obtained by coloring the imaging signal based on this difference.

Figure 7:
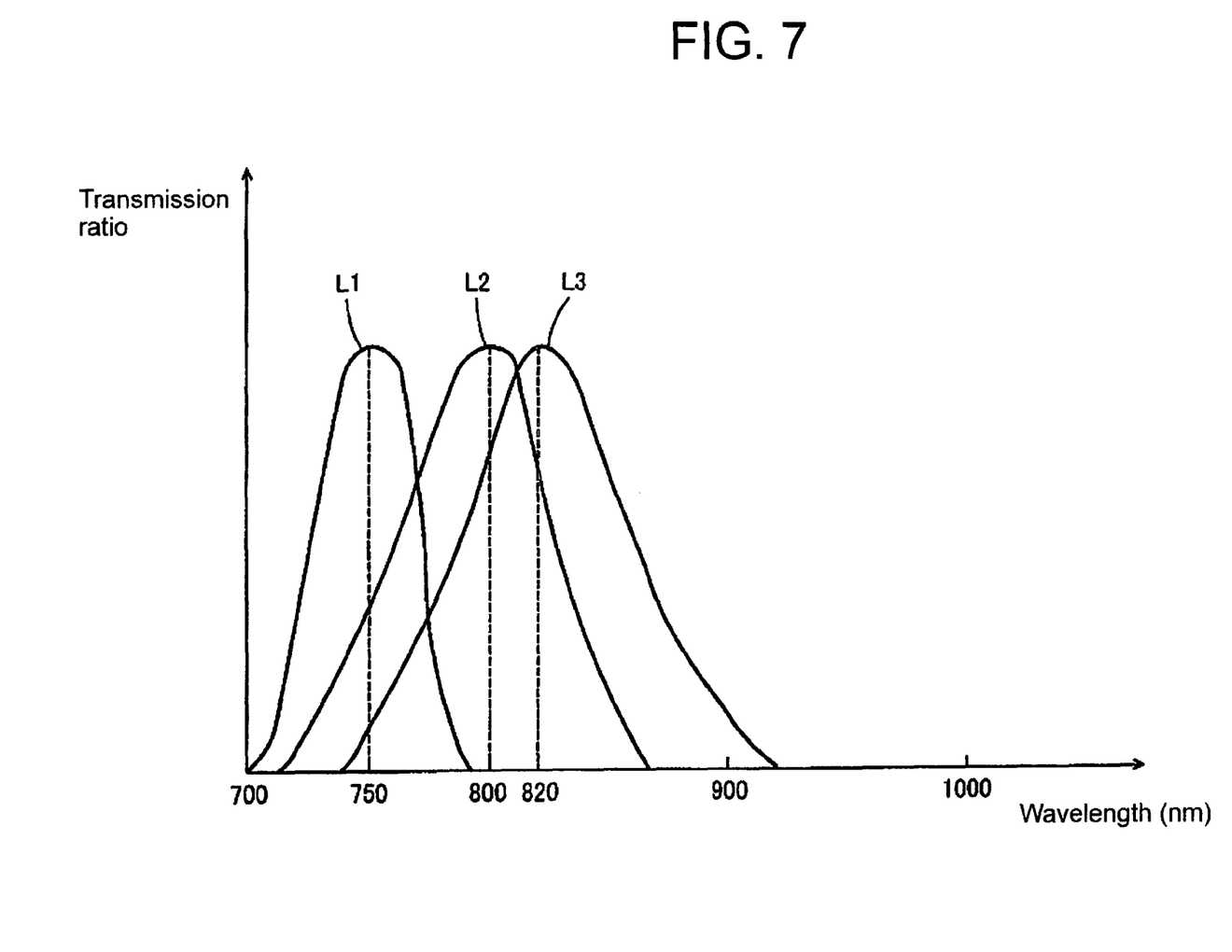
FIG. 7 is a view showing wavelengths of three infrared light lamps composing the infrared light source.

In the above embodiment, the case in which the infrared light source comprises one infrared light lamp having an emission distribution in a predetermined wavelength region in the near infrared region was described, however, in the present invention, the infrared light source may comprise, for example as shown in FIG. 7, a plurality of infrared light lamps emitting infrared lights each having a different wavelength. FIG. 7 shows each of the wavelengths of infrared light lamps L1, L2, L3 composing the infrared light source. These wavelengths are equal to the wavelengths of the infrared lights that the three color filters (the color filter FR, the color filter FG and the color filter FB) shown in FIG. 5 allow to pass through respectively. As a matter of course, when the infrared light source comprises a plurality of infrared light lamps each having a different wavelength, the wavelengths of the infrared light lamps can be set accordingly so as to be adjusted to the wavelengths of the infrared lights the color filters in use transmit respectively.

In the present embodiment, the infrared transmission filter 12 is desirably provided removably from the main body of the infrared imaging apparatus 10. This is so that when the infrared transmission filter 12 is removed and the visible light transmission filter is mounted, the infrared imaging apparatus 10 can also be functioned as the general imaging apparatus picking up the visible light as the imaging light.

As described above, the infrared imaging apparatus 10 according to the embodiment comprises the CCD sensor 13 having sensitivities in the infrared region and in the visible region; the three color filters FR, FG, FB each transmitting the visible light with the specific wavelength region and the infrared light with the specific wavelength region; and the infrared light transmission filter 12 allowing infrared light to pass through while removing visible light, wherein the CCD sensor 13 is configured to generate an imaging signal based on the infrared light passing through each of the color filters, the infrared imaging apparatus enabling the provision of the infrared imaging apparatus picking up the infrared light as the imaging light using the CCD sensor and the color filters as they are in the general imaging apparatus. As a result, an expensive image sensor such as an infrared CCD sensor no longer needs to be mounted, and thereby the manufacturing cost can be reduced. In addition, the color imaging signal depending on the spectral distribution in the infrared region can be obtained.

What is claimed is:

1. An infrared imaging apparatus comprising:
   an infrared light source with an emission distribution in an infrared region;
   an imaging lens;
   a Charge Coupled-Device (CCD) sensor in which light-sensitive elements with sensitivities in the infrared region and a visible region are arranged in a matrix-like fashion; and
   a color filter for each color, with each color filter coupled with a corresponding light-sensitive element of the light-sensitive elements;
   each color filter transmitting visible light in a specific wavelength region and infrared light in a specific wavelength regions;
   an infrared transmission filter for allowing infrared light to pass through while removing visible light;
   an imaging signal generation circuit for generating an imaging signal based on the infrared light incident to the image sensor, with the imaging signal generation circuit coloring the image signal based on differences in peak values of imaging signal output values provided by each color filter;
   a digital conversion processor for converting the imaging signal into a digital signal; and
   a memory for temporarily storing the digital signal converted by the digital conversion processor.

2. An infrared imaging apparatus comprises:
   an infrared light source with an emission distribution in an infrared region;
   an imaging lens;
   an image sensor in which light-sensitive elements with sensitivities in the infrared region and a visible region are arranged in a matrix-like fashion; and
   a color filter for each color, with each color filter coupled with a corresponding light-sensitive element of the light-sensitive elements;

each color filter transmitting visible light in a specific wavelength region and infrared light in a specific wavelength region;

an infrared transmission filter for allowing infrared light to pass through while removing visible light;

an imaging signal generation circuit for generating an imaging signal based on the infrared light incident to the image sensor, with the imaging signal generation circuit coloring the image signal based on differences in peak values of imaging signal output values provided by each color filter.

3. The infrared imaging apparatus according to claim 2, comprising:

a digital conversion processor for converting the imaging signal to a digital signal; and a memory for temporarily storing the digital signal converted by the digital conversion processor.

4. The infrared imaging apparatus according to claim 3, wherein the image sensor is a Charge Coupled-Device (CCD) sensor.

5. The infrared imaging apparatus according to claim 3, wherein the image sensor is a Complementary Metal Oxide Semiconductor (CMOS) sensor.

6. The infrared imaging apparatus according to claim 2, wherein the infrared transmission filter is removably provided.

7. The infrared imaging apparatus according to claim 2, wherein on a front side of each of the light-sensitive elements, a red light color filter allowing the red light to pass through, a green light color filter allowing the green light to pass through, and a blue light color filter allowing the blue light to pass through are provided respectively so as to be placed in a predetermined array.

8. The infrared imaging apparatus according to claim 7, wherein the red light color filter allows the infrared light with a wavelength around 750 nm to pass through, in addition to allowing the visible light with a wavelength around 600 nm to pass through.

9. The infrared imaging apparatus according to claim 7, wherein the green light color film allows the infrared light with a wavelength around 800 nm to pass through, in addition to allowing the visible light with a wavelength around 530 nm to pass through.

10. The infrared imaging apparatus according to claim 7, wherein the blue light color filter allows the infrared light with a wavelength around 820 nm to pass through, in addition to allowing the visible light with a wavelength around 450 nm to pass through.

11. The infrared imaging apparatus according to claim 2, wherein the infrared light source is one infrared light lamp.

12. The infrared imaging apparatus according to claim 2, wherein the infrared light source is a plurality of infrared light lamps emitting infrared light with different wavelengths.

13. The infrared imaging apparatus according to claim 7, wherein the infrared light source is a plurality of infrared light lamps emitting infrared light with different wavelengths, each of the wavelengths of the plurality of infrared light lamps being equal to each of the wavelengths of the infrared light that each color filter of the red light color filter, the green light color filter and the blue light color filter allow to pass through.

* * * * *